United States Patent
Yen

(10) Patent No.: US 7,126,829 B1
(45) Date of Patent: Oct. 24, 2006

(54) ADAPTER BOARD FOR STACKING BALL-GRID-ARRAY (BGA) CHIPS

(75) Inventor: Yao Tung Yen, Cupertino, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 346 days.

(21) Appl. No.: 10/708,101

(22) Filed: Feb. 9, 2004

(51) Int. Cl.
*H05K 1/11* (2006.01)
*H01L 23/538* (2006.01)

(52) U.S. Cl. .................. 361/803; 361/767; 361/768; 361/774; 361/783; 257/686

(58) Field of Classification Search .................. None
See application file for complete search history.

(56) References Cited

U.S. PATENT DOCUMENTS

| | | | |
|---|---|---|---|
| 5,744,827 A | 4/1998 | Jeong et al. ................ 257/686 |
| 5,818,107 A * | 10/1998 | Pierson et al. .............. 257/723 |
| 5,910,010 A | 6/1999 | Nishizawa et al. .......... 438/15 |
| 6,157,080 A | 12/2000 | Tamaki et al. .............. 257/738 |
| 6,188,127 B1 * | 2/2001 | Senba et al. ................ 257/686 |
| 6,339,254 B1 | 1/2002 | Venkateshwaran et al. . 257/686 |
| 6,376,769 B1 * | 4/2002 | Chung ........................ 174/52.2 |
| 6,414,381 B1 | 7/2002 | Takeda ........................ 257/676 |
| 6,461,895 B1 | 10/2002 | Liang et al. ................. 438/107 |
| 6,472,735 B1 * | 10/2002 | Isaak ........................... 257/686 |
| 6,483,718 B1 * | 11/2002 | Hashimoto .................. 361/803 |
| 6,542,393 B1 * | 4/2003 | Chu et al. ..................... 365/51 |
| 6,576,992 B1 | 6/2003 | Cady et al. ................. 257/686 |
| 6,587,393 B1 | 7/2003 | Ayukawa et al. ...... 365/230.03 |
| 6,861,737 B1 * | 3/2005 | Jeong et al. ................ 257/680 |
| 2003/0001288 A1 | 1/2003 | Tay et al. .................... 257/780 |
| 2003/0081392 A1 | 5/2003 | Cady et al. ................. 361/767 |
| 2003/0107118 A1 | 6/2003 | Pflughaupt et al. ......... 257/686 |
| 2004/0212071 A1 * | 10/2004 | Moshayedi .................. 257/686 |

\* cited by examiner

*Primary Examiner*—John B. Vigushin
(74) *Attorney, Agent, or Firm*—g Patent LLC; Stuart T. Auvinen

(57) ABSTRACT

Electronic devices packaged with arrayed solder balls, leads, or pads, such as Ball Grid Array (BGA) devices, are stacked together. Each stack has a bottom adapter card with metal contacts on a top surface in an array to match the array of solder balls of a lower BGA package, and final bonding pads on a bottom surface that are soldered to an underlying motherboard or printed-circuit board (PCB). An upper BGA package has its solder balls connected to a matching array of metal contacts on a top surface of an intermediate adapter card. Metal traces on the intermediate adapter card connect to lead frame pins that wrap around the edge of the intermediate adapter card and make contact with peripheral pads on the top surface of the bottom adapter card. Lead frame pins and peripheral pads can connect several intermediate adapter cards together with one bottom adapter card.

19 Claims, 5 Drawing Sheets

ADAPTER BOARD FOR STACKING BALL-GRID-ARRAY (BGA) CHIPS

BACKGROUND OF INVENTION

This invention relates to stacking memory chips and more particularly to stacking Ball-Grid-Array (BGA) chips.

The size of Personal Computer (PC) components is constantly shrinking. Printed circuit board area is at a premium. PC system designers look for integrated circuits (IC's) that have the smallest form factors so more chips can be placed in less board space. As PC clock speeds increase there is also the need to bring integrated circuits closer together to minimize signal delay between chips. This has led to many innovative ways to configure integrated circuits on printed circuit boards.

Typically, memory chips are disposed on the surface of a substrate in a side-by-side arrangement with space left between to provide regions for electrical conductors for electrical interconnection of the chips. Chips can be electrically connected to substrate contact locations through chip leads located on the sides or bottom of each chip package. Currently, the densest packaging configuration for memory chips, such as Dynamic Random Access Memory (DRAM), may be obtained through the construction of memory chips placed side by side on both sides of a compact Printed Circuit Board (PCB) substrate. Each side of the PCB and wiring layers within the PCB contain electrical connections that include power supply, data, address and control lines.

However, the side-by-side arrangement of memory chips may not be the densest configuration that can be achieved. A better configuration might be to construct dense packages of stacked memory chips. This can be achieved through the use of adapter substrates that would allow memory chips to be connected on top of each other to construct a tower of memory. Each adapter substrate may sit directly on top of the next substrate with the substrate contact locations of adjacent chips aligned over one another. The bottom-most adapter card connects directly to the PCB.

It is possible to stack some types of electronic chips on top of each other to gain dense configurations. For example, Dual-In-line (DIP) and Thin Small Outline Package (TSOP) chips have connector pins that come out the sides of the package so they can be stacked in a piggy-back configuration. In other cases, adapter boards must be used to convert one pin configuration to another, such as to convert pins from a TSOP package to a Pin Grid Array Package (PGA).

Some integrated circuit packages allow for stacking of the electronic die within the package itself. For example, the Quad Flat No-lead (QFN) package can contain two stacked chips bonded back to back inside the same device. This type of QFN package allows each chip within the package to use the same pins on the QFN package lead frame. The QFN package lead frame has the contact pads on the bottom and sides of the package.

However, stacking of electronic chips such as the Ball Grid Array (BGA) is more difficult because BGA devices have contact pads in an array on the underside of the package body, rather than around the perimeter. What is desired is to stack BGA chips. It is desirable to stack BGA chips in a piggy-pack fashion.

DETAILED DESCRIPTION

The present invention relates to an improvement in stacking of BGA memory chips. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has discovered that electronic chips with contact pads on the bottom of the package, such as BGA chips, can be connected together in a very dense stacked configuration. Adapter cards are placed between each pair of stacked BGA chips to route signals to the periphery. Besides the advantage of saving space, stacking BGA devices using adapter cards with peripheral lead frames allows standard BGA devices to be probed more easily for testing purposes. As a result, it is possible to achieve low cost assembly and easy testing.

Two different types of adapter cards are used to stack multiple BGA chips together: a bottom adapter card and an intermediate adapter card. The bottom adapter card connects the bottom BGA chip in a stack to a PCB and passes signals to upper BGA chips in the stack. The intermediate adapter card connects all BGA chips in the stack to one another and connects the stack to the bottom adapter card. An intermediate adapter card is used for every BGA chip above the first BGA chip in a stack.

Figure 1A:
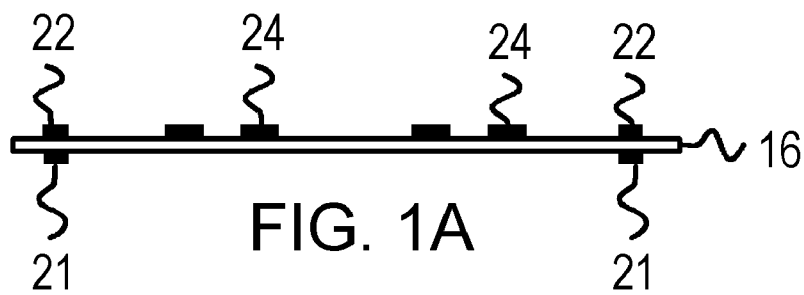
FIG. 1A is a side view of a bottom adapter card.

FIG. 1A is a side view of a bottom adapter card. Bottom adapter card 16 can be made of a very thin polymer material such as fiberglass. On each major surface of adapter card 16 are sets of metal contacts. Top metal contacts 24 are aligned with the BGA balls or pads found on the bottom of a BGA package. Perimeter pads 22 are aligned to make contact on the top with the lead frame of an intermediate adapter card. On the bottom surface of bottom adapter card 16, final bonding pads 21 are placed to make contact with pads on a PCB.

Figure 1B:
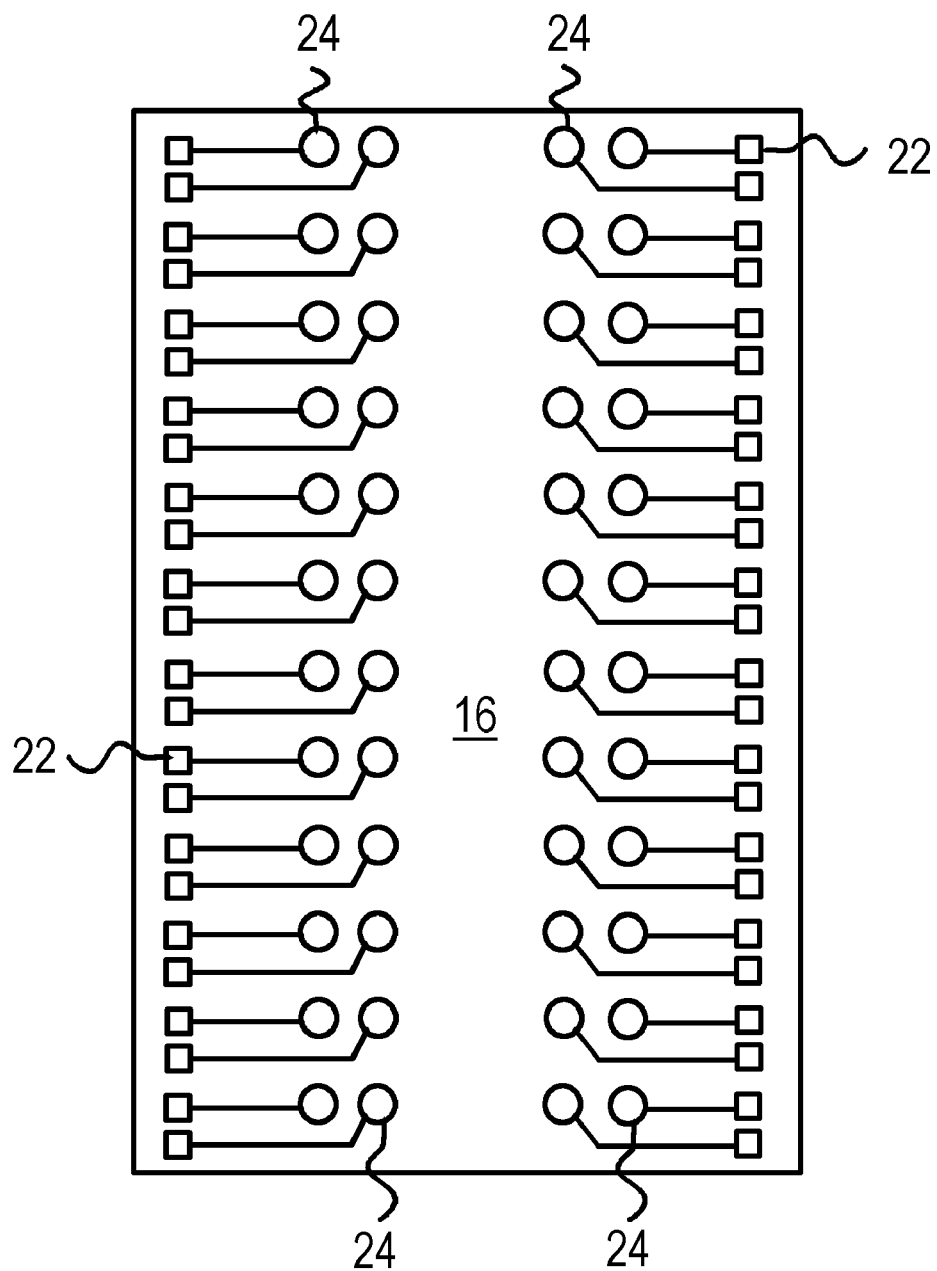
FIG. 1B is a top view of a bottom adapter card.

FIG. 1B shows a top view of bottom adapter card 16. This top view shows the outline of a BGA footprint (pin layout) of arrayed pads of metal contacts 24. Each of metal contacts 24 connects to a metal trace on bottom adapter card 16 that leads to the one of peripheral pads 22 on the top surface, and to a final bonding pad 21 on the bottom surface. Vias can connect one of peripheral pads 22 on the top surface with one of final bonding pad 21 on the bottom surface. The vias can be adjacent to a pair of pads 21, 22 that are aligned to each other, or the locations of electrically connected peripheral pads 22 and final bonding pad 21 may not correspond or be aligned.

A different bottom adapter card 16 is required for each different BGA device that has a different arrayed-pad footprint, since metal contacts 24 must match the BGA chip's pad footprint. Only the bottom BGA device in a stack uses a bottom adapter card 16, since bottom adapter card 16 connects to the underlying PCB.

Figure 2A:
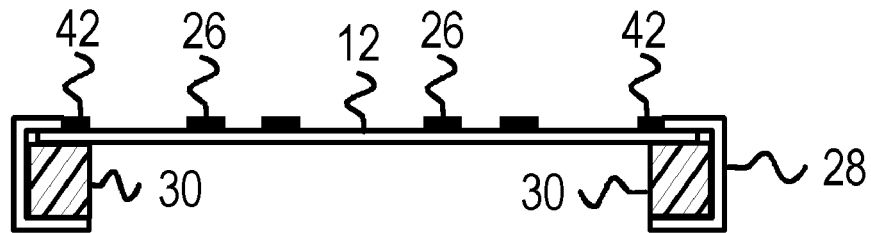
FIG. 2A is a side view of an intermediate adapter card.

FIG. 2A shows a side view of an intermediate adapter card. Intermediate adapter card 12 also can be made of a very thin polymer material such as fiberglass. On the top surface of intermediate adapter card 12 are sets of metal contacts 26. Metal contacts 26 are aligned with an array of BGA pads found on the bottom of the BGA package.

Peripheral pads 42 connect to lead frame pins 28 that are formed out and around the edge of the intermediate adapter card 12. Molding 30 is a molded frame that adds support to lead frame pins 28. Molding 30 can be plastic or other material. The height of molding 30 is determined by the height of the BGA package.

Lead frame pins 28 make contact on the top surface of intermediate adapter card 12 with peripheral pads 42. The bottom of lead frame pins 28 of intermediate adapter card 12 can be soldered to peripheral pads the top surface of either bottom adapter card 16 or the top surface of another intermediate adapter card 12.

Figure 2B:
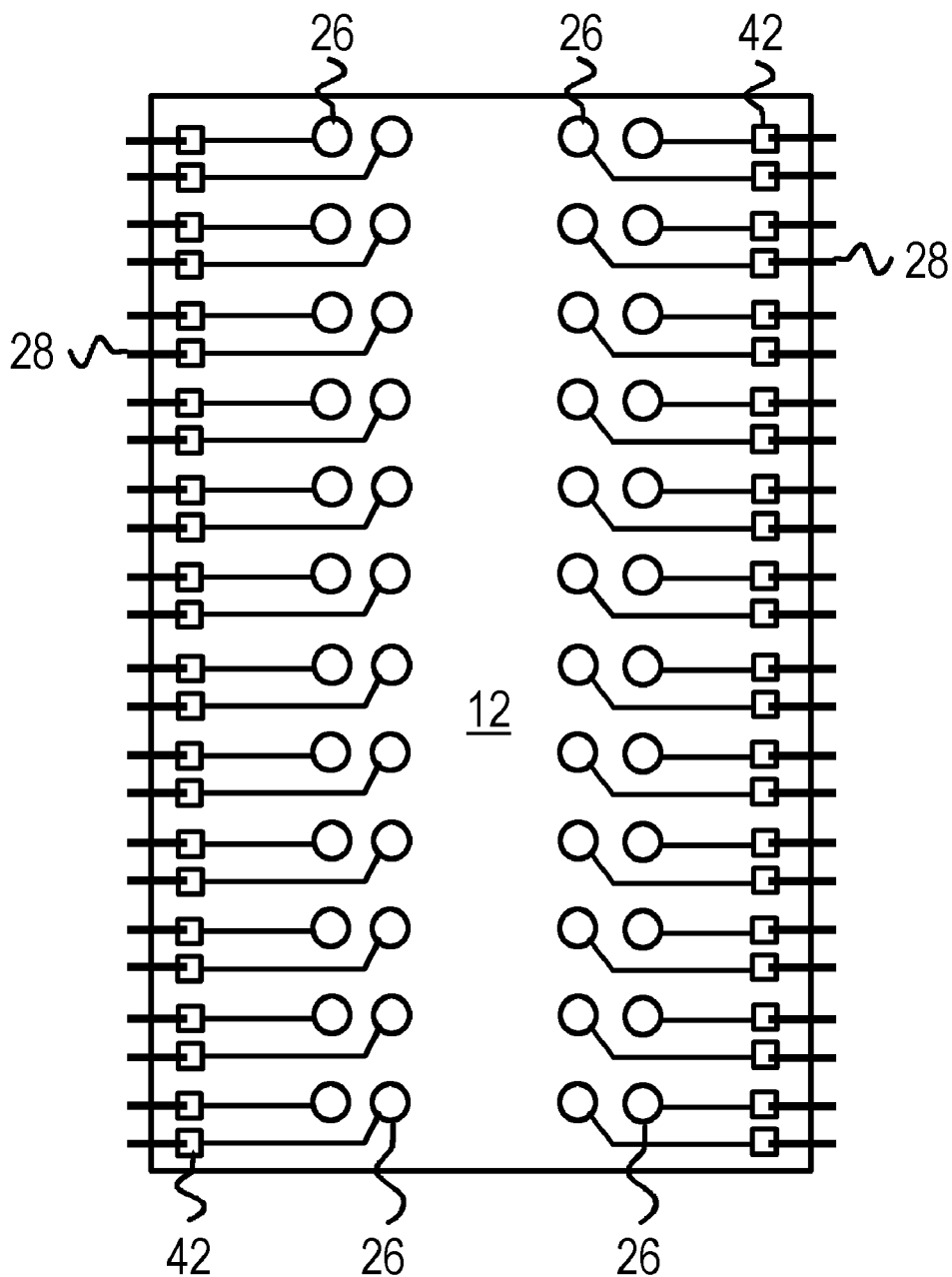
FIG. 2B is a top view of an intermediate adapter card.

FIG. 2B shows a top view of intermediate adapter card 12. Metal contacts 26 match the footprint of the BGA balls or pads. Each of metal contacts 26 connects to a metal trace on intermediate adapter card 12 that connects to one of peripheral pads 42 and to one of lead frame pins 28. Intermediate adapter card 12 is used to stack multiple BGA devices on top of each other.

Figure 3A:
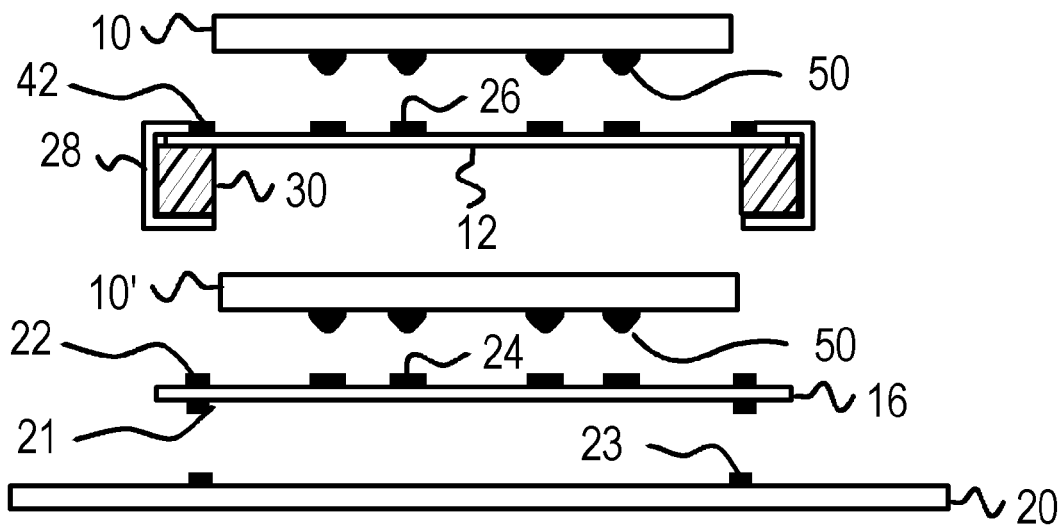
FIG. 3A illustrates the components used to connect two BGA devices to a PCB.

FIG. 3A shows components used to stack two BGA devices together. The components are to be stacked together and mounted onto PCB 20. Two BGA devices 10, 10' are to be mounted to each other as a stack. Bottom adapter card 16 shown in FIGS. 1A–B fits under lower BGA device 10', while intermediate adapter card 12 shown in FIGS. 2A–B fits between top BGA device 10 and lower BGA device 10'. The actual order of manufacturing steps may differ from the order shown in FIGS. 3A–E.

Figure 3B:
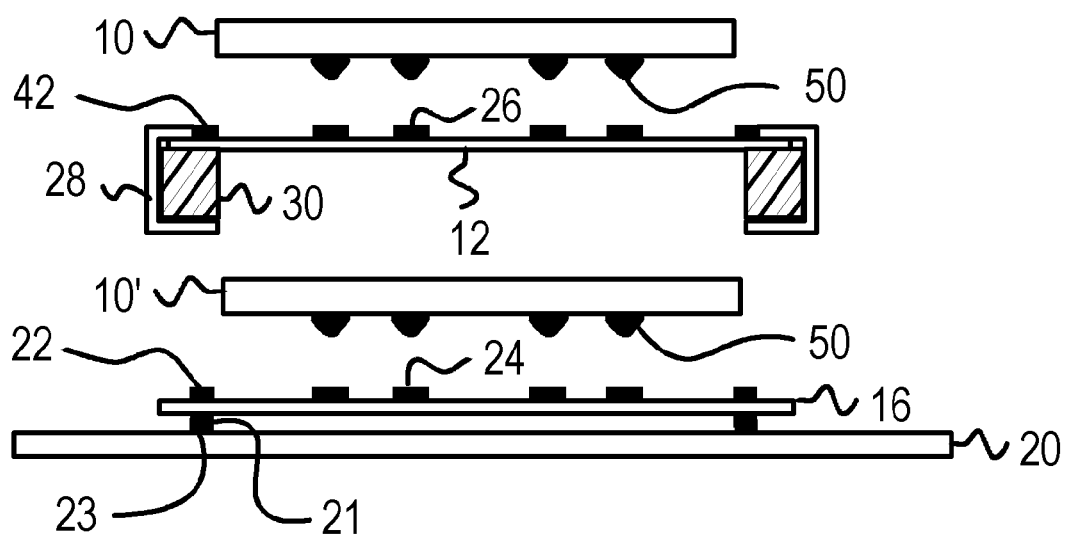
FIG. 3B shows the components of FIG. 3A with a bottom adapter card connected to the PCB.

FIG. 3B shows components shown in FIG. 3A with bottom adapter card 16 connected to the PCB 20. Final bonding pads 21 on the bottom surface of bottom adapter card 16 were align to pad areas on the top surface of PCB 20. Solder paste could be applied to final bonding pad 21 to allow for soldering of bottom adapter card 16 to PCB 20.

Figure 3C:
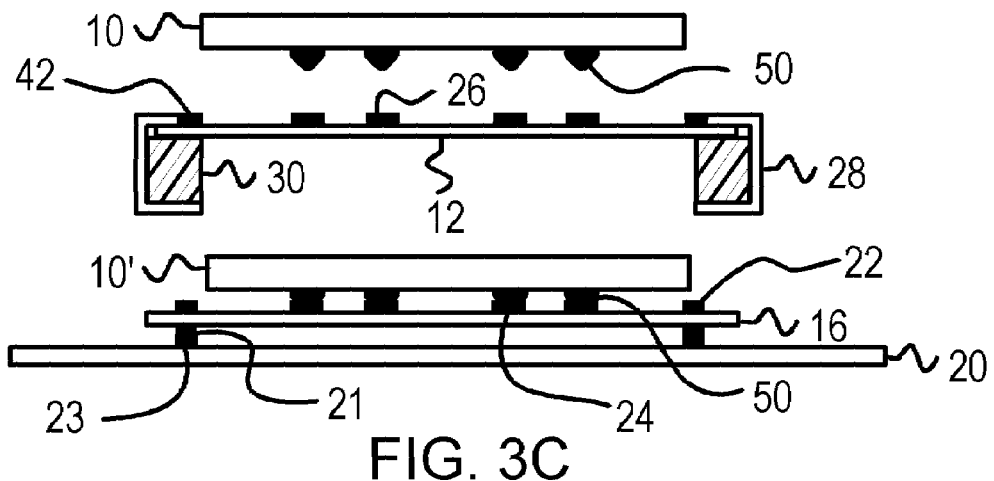
FIG. 3C depicts the bottom BGA chip in contact with a bottom adapter card that is connected to the PCB.

FIG. 3C shows the bottom adapter card connected to the PCB and to the lower BGA device. Lower BGA device 10' has an array of contact balls for soldering that are aligned with metal contacts 24 on the top surface of bottom adapter card 16. Contact balls on lower BGA device 10' are electrically connected to PCB 20 through metal traces, from metal contacts 24 to peripheral pads 21 on bottom adapter card 16.

Figure 3D:
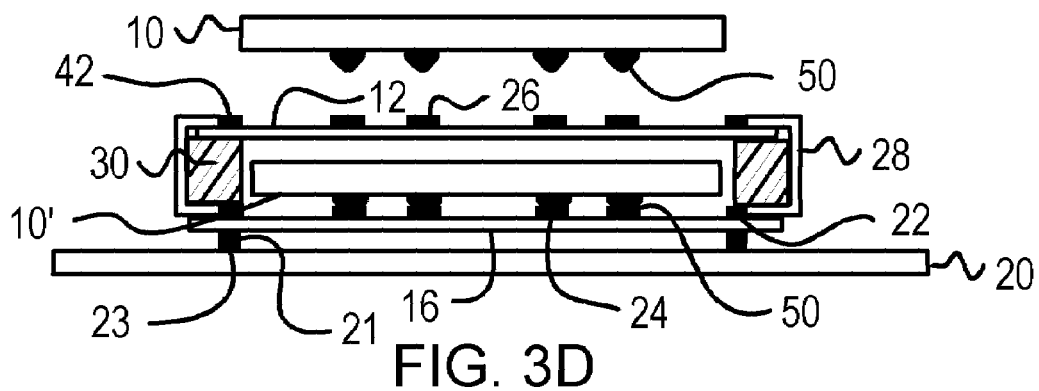
FIG. 3D portrays an intermediate adapter card attached to a bottom adapter card that is connected to the PCB.

FIG. 3D shows the intermediate adapter card mounted to the bottom adapter card. The bottom of lead frame pins 28 are align and soldered to peripheral pads 22 on the top surface of bottom adapter card 16. Electrical signals from PCB 20 are passed through bottom adapter card 16 to reach intermediate adapter card 12.

Figure 3E:
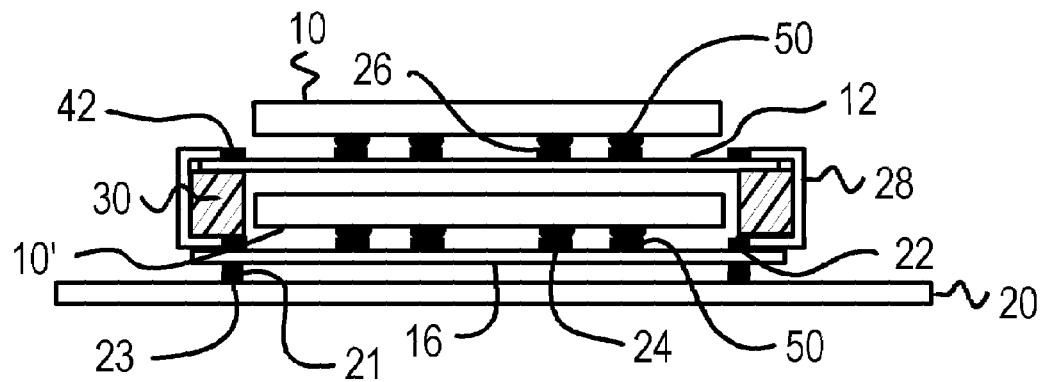
FIG. 3E shows a complete stack of two BGA chips connected to the PCB using an intermediate adapter card and a bottom adapter card.

FIG. 3E shows the final assembled stack of two BGA devices. Top BGA device 10 has an array of contact balls 50 for soldering that are aligned with metal contacts 26 on the top surface of intermediate adapter card 12. Contact balls 50 on top BGA device 10 are electrically connected to PCB 20 through metal traces on intermediate adapter card 12 that connect metal contacts 26 to peripheral pads 42, which connect to lead frame pins 28 to peripheral pads 22 on bottom adapter card 16. Then vias and metal traces on bottom adapter card 16 connect peripheral pads 22 on the top surface to final bonding pads 21 on the bottom surface, finally connecting to pads on PCB 20.

Signals on both BGA devices 10, 10' are thus electrically connected through the intermediate and bottom adapter cards to the PCB. Note that each signal from PCB 20 travels about the same distance to a pin on either top BGA device 10 or lower BGA device 10'. This feature minimizes the signal propagation time and signal skew among the BGA devices 10, 10', 'etc, in a stack.

Figure 4:
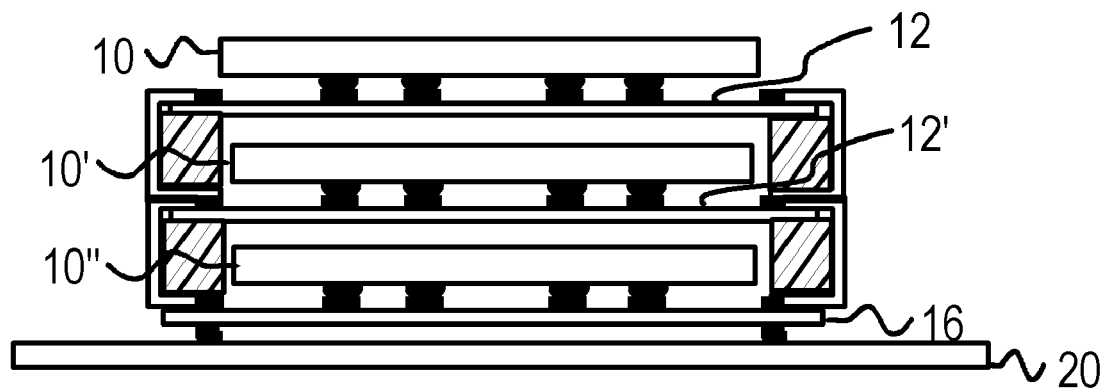
FIG. 4 is an example of a stack of three BGA chips connected to a PCB using two intermediate adapter cards and one bottom adapter card.

FIG. 4 shows three BGA devices in a stack. Three BGA devices 10, 10', 10" are connected using two intermediate adapter cards 12, 12' and one bottom adapter card 16. Lead frame pins 28 on upper intermediate adapter card 12' are aligned with and soldered to peripheral pads 22 on lower intermediate adapter card 12.

Figure 5:
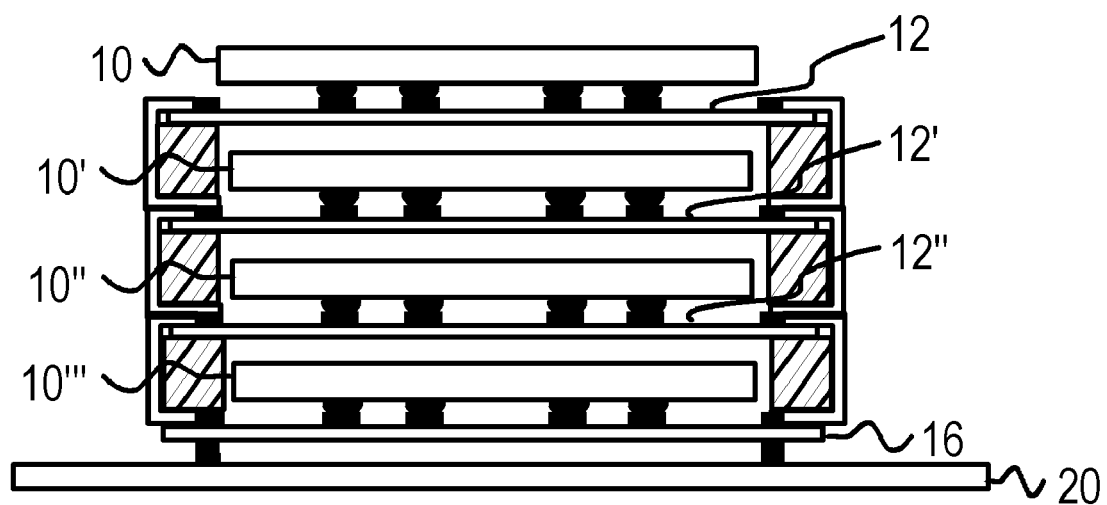
FIG. 5 is a configuration showing a stack of four BGA chips connected to a PCB with multiple intermediate adapter cards and one bottom adapter card.

FIG. 5 shows the components described in FIG. 3A that stack four BGA devices together. BGA devices 10, 10', 10", 10''' using multiple intermediate adapter cards 12, 12', 12" and one bottom adapter card 16. Lead frame pins 28 on upper intermediate adapter card 12 are aligned with and soldered to peripheral pads 22 on lower intermediate adapter card 12'. Likewise, lead frame pins 28 on middle intermediate adapter card 12' are aligned with and soldered to peripheral pads 22 on lower intermediate adapter card 12".

ALTERNATE EMBODIMENTS

Several other embodiments are contemplated by the inventor. For example, the PCB can be a DIMM board or other type of interface board, such as PC motherboard. The material used for intermediate adapter card 12 or bottom adapter card 16 could be a very thin polymer material such as fiberglass, or could be a flexible cable material or some other type of material that carries signals from one BGA device to another.

In FIG. 1 and FIG. 2 the adapter cards are laid out with the BGA contact pads (device footprint) laid out in a sequential format where the number of peripheral pads equals the number of pads on the bottom of the BGA package. However, the number of peripheral pads can be different from the number of BGA pads. Additional pins can be added for different purposes such as adding extra control or clock enabling signals. No-connect pins could have missing metal traces or otherwise disconnected.

In other embodiments the BGA devices can be replaced with other types of electronic packaging with arrayed balls, contacts, or pads. Alternative methods of bonding the chips to the adapter boards can be substituted. Alternative configurations of stacking the electronic devices are possible. Also, the method of placing the electronic devices on the adapter cards could use automated equipment or manual placement.

In another embodiment, the footprint and layout of the bottom and intermediate adapter cards can be totally different from one another. For example, the bottom and intermediate adapter cards may have different trace layouts or there may be more than two adapter cards that carry dissimilar signals or dissimilar electronic devices in one stack.

In yet other embodiments, different bonding techniques can be used to connect the electronic devices to the adapter card. For example, ultrasonic waves can be used to solder the devices to the adapter cards and solder of different melting points may be selected for different steps in the bonding process. The solder balls of the BGA packages may be spherical, hemi-spherical, or have some other shape.

In another embodiment the adapter with the lead frame may be connected to the adjacent adapter card using solder to make the stack mechanically rigid. In another embodiment the bottom of the adapter with the lead frame can be glued to the board below or it can be glued to the electronic device below to make the stack mechanically rigid.

In other embodiments, the electronic devices need not be bonded to the top of the adapter card. Instead, electronic devices can be flipped over on their back or sides and connected to the adapter cards. Other components may be attached at the bottom side of the adapter card to enhance the memory stack performance. For example, by-pass capacitors, resistors, or logic devices are useful components to attach at the bottom side of the adapters. In yet other cases plated copper can be added to the bottom of the adapter cards to help thermal dissipation or as a ground plane.

The steps to mount the BGA devices to the bottom adapter card and intermediate adapter cards and underlying PCB can occur in different orders. For example, each BGA device can be mounted to an adapter card, then the card/BGA device assemblies soldered together, finally the stack soldered to a PCB. Some BGA pins may be no-connect pins and do not have to be connected to the peripheral pads.

It is to be understood that the embodiments described above are simply illustrative of the principles of the invention. Various other modifications and changes may be devised by those of skill in the art which will embody the principles of the invention and fall within the spirit and scope thereof.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. Sect. 1.72(b). Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A multi-chip package comprising:
an upper arrayed package having a two-dimensional array of electrical connections with at least four rows and four columns;
a lower arrayed package having a two-dimensional array of electrical connections with at least four rows and four columns;
an intermediate adapter card between the upper arrayed package and the lower arrayed package;
a bottom adapter card between the lower arrayed package and a circuit board;
first metal contacts on a first surface of the intermediate adapter card, the first metal contacts disposed in an array to match the two-dimensional array of electrical connections of the upper arrayed package;
lead frame pins that wrap around edges of the intermediate adapter card from the first surface to below a second surface of the intermediate adapter card;
first metal traces on the first surface of the intermediate adapter card to electrically connect the first metal contacts to the lead frame pins;
peripheral pads around a periphery of a first surface of the bottom adapter card, the peripheral pads disposed to make electrical contact with the lead frame pins from the intermediate adapter card;
second metal contacts on the first surface of the bottom adapter card, the second metal contacts disposed in an array to match the two-dimensional array of electrical connections of the lower arrayed package;
second metal traces on the first surface of the bottom adapter card to electrically connect the second metal contacts to the peripheral pads; and
final bonding pads on a second surface of the bottom adapter card, for making electrical contact with the circuit board,
whereby the upper arrayed package and the lower arrayed package are stacked together using the intermediate adapter card and the bottom adapter card to route arrayed electrical connections to the periphery.

2. The multi-chip package of claim 1 further comprising:
vias through the bottom adapter card to connect the peripheral pads on the first surface to the final bonding pads on the second surface of the bottom adapter card.

3. The multi-chip package of claim 2 wherein the two-dimensional array of electrical connections of the upper arrayed package and of the lower arrayed package are solder balls, pads, leads, or pins in an array.

4. The multi-chip package of claim 3 wherein the upper arrayed package and the lower arrayed package are Ball Grid Array (BGA) packages.

5. The multi-chip package of claim 4 wherein the upper arrayed package and the lower arrayed package have a same footprint of the two-dimensional array of electrical connections with at least four rows and four columns.

6. The multi-chip package of claim 5 wherein the upper arrayed package and the lower arrayed package are memory chips.

7. The multi-chip package of claim 3 further comprising:
a molding attached to the second surface of the intermediate adapter card;
wherein the lead frame pins are shaped by the molding.

8. The multi-chip package of claim 3 further comprising:
a third arrayed package having a two-dimensional array of electrical connections with at least four rows and four columns;
an upper intermediate adapter card between the third arrayed package and the upper arrayed package;
third metal contacts on a first surface of the upper intermediate adapter card, the third metal contacts disposed in an array to match the two-dimensional array of electrical connections of the third arrayed package;
second lead frame pins that wrap around edges of the upper intermediate adapter card from the first surface to below a second surface of the upper intermediate adapter card;

third metal traces on the first surface of the upper intermediate adapter card to electrically connect the third metal contacts to the second lead frame pins; and second peripheral pads around a periphery of a first surface of the intermediate adapter card, the second peripheral pads disposed to make electrical contact with the second lead frame pins from the upper intermediate adapter card, wherein three arrayed packages are stacked together.

9. A stacked Ball Grid Array (BGA) package comprising:
a top BGA device having an array of first contacts on a lower surface;
a bottom BGA device having an array of second contacts on a lower surface;
an intermediate adapter card having a top surface facing the lower surface of the top BGA device, and a lower surface facing the bottom BGA device;
a first array of metal contacts on the top surface of the intermediate adapter card for electrically contacting the array of first contacts of the top BGA device;
intermediate metal traces on the intermediate adapter card that connect to the first array of metal contacts;
peripheral connectors, electrically connected to the intermediate metal traces, disposed around edges of the intermediate adapter card;
a bottom adapter card having a top surface facing the lower surface of the bottom BGA device, and a lower surface facing a mounting board;
a second array of metal contacts on the top surface of the bottom adapter card for electrically contacting the array of second contacts of the bottom BGA device;
peripheral pads on the top surface of the bottom adapter card, for contacting the peripheral connectors of the intermediate adapter card;
bottom metal traces on the bottom adapter card that connect the second array of metal contacts to the peripheral pads;
final bonding pads on the bottom adapter card and electrically connected to the bottom metal traces, for soldering to the mounting board, and
a molding under the lower surface of the intermediate adapter card, the molding for shaping the peripheral connectors into a U shape.

10. The stacked BGA package of claim 9 wherein the bottom metal traces on the bottom adapter card are formed on the top surface of the bottom adapter card.

11. The stacked BGA package of claim 10 further comprising:
vias through the bottom adapter card for connecting the bottom metal traces on the top surface of the bottom adapter card to the final bonding pads on the lower surface of the bottom adapter card.

12. The stacked BGA package of claim 11 wherein the peripheral connectors of the intermediate adapter card are soldered to the peripheral pads of the bottom adapter card to make electrical connections.

13. The stacked BGA package of claim 9 wherein the intermediate metal traces on the intermediate adapter card are formed on the top surface of the intermediate adapter card.

14. The stacked BGA package of claim 9 further comprising the mounting board, wherein the mounting board is a printed-circuit board (PCB), a motherboard, or a memory module substrate.

15. The stacked BGA package of claim 9 wherein the top BGA device and the bottom BGA device are each packaged integrated circuits.

16. The stacked BGA package of claim 15 wherein the array of first contacts has at least four columns and at least four rows;
wherein the array of second contacts has at least four columns and at least four rows.

17. The stacked BGA package of claim 15 wherein the peripheral connectors are lead frame pins.

18. A stacked-chip assembly for mounting on a mounting board comprising:
upper arrayed package means, having a two-dimensional array of electrical connections with at least four rows and four columns, for connecting an enclosed integrated circuit through the two-dimensional array of electrical connections;
lower arrayed package means, having a two-dimensional array of electrical connections with at least four rows and four columns, for connecting an enclosed integrated circuit through the two-dimensional array of electrical connections;
intermediate adapter card means for interfacing to the upper arrayed package means;
bottom adapter card means for interfacing between the lower arrayed package means and a circuit board;
first metal contact means, on a first surface of the intermediate adapter card means, for matching a footprint of the two-dimensional array of electrical connections of the upper arrayed package means;
lead frame means for wrapping around edges of the intermediate adapter card means from the first surface to below a second surface of the intermediate adapter card means;
first metal means, on the first surface of the intermediate adapter card means, for electrically connecting the first metal contact means to the lead frame means;
peripheral pad means, disposed around a periphery of a first surface of the bottom adapter card means, for making electrical contact with the lead frame means from the intermediate adapter card means;
second metal contact means, on the first surface of the bottom adapter card means, for matching a footprint of the two-dimensional array of electrical connections of the lower arrayed package means;
second metal means, on the first surface of the bottom adapter card means, for electrically connecting the second metal contact means to the peripheral pad means; and
final bonding pad means, on a second surface of the bottom adapter card means, for making electrical contact with the circuit board,
whereby the upper arrayed package means and the lower arrayed package means are stacked together using the intermediate adapter card means and the bottom adapter card means to route arrayed electrical connections to the periphery.

19. The stacked-chip assembly of claim 18 wherein the upper arrayed package means is a Ball Grid Array (BGA) package; and
wherein the lower arrayed package means is a BGA package.

* * * * *